United States Patent [19]

Rider

[11] 4,443,729
[45] Apr. 17, 1984

[54] PIEZOCERAMIC BENDER ELEMENT HAVING AN ELECTRODE ARRANGEMENT SUPPRESSING SIGNAL DEVELOPMENT IN MOUNT REGION

[75] Inventor: Billie F. Rider, Cedar Rapids, Iowa

[73] Assignee: Rockwell International Corporation, El Segundo, Calif.

[21] Appl. No.: 276,112

[22] Filed: Jun. 22, 1981

[51] Int. Cl.³ .............................................. H01L 41/00
[52] U.S. Cl. ..................................... 310/330; 310/332
[58] Field of Search ............... 310/328, 330, 332, 333, 310/348, 354, 357, 365, 366, 368, 369, 331, 363, 364

[56] References Cited

U.S. PATENT DOCUMENTS

| | | | |
|---|---|---|---|
| 2,365,738 | 12/1944 | Williams | 310/332 |
| 2,639,257 | 5/1953 | Szegvari et al. | 310/332 |
| 2,841,722 | 7/1958 | Gravley | 310/330 |
| 3,474,268 | 10/1969 | Rudnick | 310/328 |

Primary Examiner—J. D. Miller
Assistant Examiner—D. L. Rebsch
Attorney, Agent, or Firm—Edward A. Gerlaugh; George A. Montanye; H. Fredrick Hamann

[57] ABSTRACT

A piezoceramic bender element for operation in the AC generator mode below the device resonant frequency and having an electrode configuration which removes from the active electrical circuit the ends of the element where relatively high levels of mechanical stress develop.

7 Claims, 4 Drawing Figures

PIEZOCERAMIC BENDER ELEMENT HAVING AN ELECTRODE ARRANGEMENT SUPPRESSING SIGNAL DEVELOPMENT IN MOUNT REGION

BACKGROUND OF THE INVENTION

The present invention relates to electric generator structures, and more particularly, to a piezoelectric sensor having a particular electrode arrangement.

The advancement, at lower cost, in the art of precision flight control and guidance of aircraft, missiles and space vehicles depends in part on progress in sensor technology. Present computer technology allows sophisticated and complex signal processing at reasonable cost, but the information processed is frequently derived from sensors having a cost which is a disproportionate part of the system cost. Other typical sensor limitations are poor accuracy and low reliability.

A characteristic inherent of piezoelectric devices that depend on remanent polarization is that they are susceptible to changes in output impedance and scale factor if exposed to substantial electrical, mechanical, or temperature stress. These changes affect the repeatability of the device parameters. The effects of offending stresses are time dependent, with long-term stresses being more detrimental than short-term stresses. Instrument applications such as accelerometers can be implemented without exposing the piezoelectric device to large DC voltages; therefore, electrical stress can be virtually eliminated as a factor affecting repeatability. Mechanical stresses occur at interfaces between the piezoelectrical material and other material of the device due primarily to mismatches in temperature coefficients of expansion. In addition to interface mechanical stress, temperature changes can cause device parameter changes; however, much of the change appears to be reversible and thus has minimal effect on scale-factor repeatability. The net effect of temperature swings is thus mechanical stresses exerted on the active piezoelectric material at the various interfaces associated with the device. Such temperature-induced mechanical stresses result in thermal hysteresis effects and changes of scale factor; therefore, for instrument applications, undesired or uncontrolled interface stresses must be reduced to the greatest extent possible.

Instruments utilizing commercially available piezoelectric ceramic sensors are susceptible to appreciable scale factor uncertainty, when exposed to extreme temperature variations such as those encountered in aerospace environments. Commercially available piezoelectric ceramic sensors are constructed, for example, of two layers of lead zirconate titante (PZT) bonded to a central layer of brass or steel. Representative ones of such devices were tested in the bender mode and were found to be unstable when exposed to repeated extreme temperature cycles; a scale factor change of five percent after several cycles was common. The tested devices exhibited long-term as well as short term changes. Accordingly, there is a need for a piezoelectric sensor having long-term stability and repeatablity of output impedance and scale factor in an environment of extreme variations of temperature.

SUMMARY OF THE INVENTION

In view of the problems of commercially available state-of-the art sensors, described above, it is a general objective of the present invention to develop an improved low-cost sensor for generating signals representative of accelerations and angular rates of a vehicle.

A more specific object of the invention is to provide an improved piezoelectric bender element.

Another object of the invention is to provide an improved rate/acceleration sensor suitable for use in an aerospace environment, and having a bias stability approaching 5 degrees per hour with scale-factor error less than 0.4 percent.

In accordance with one aspect of the invention, there is provided an improved piezoelectric sensor including a bender element having a pair of piezoceramic plates with an internal electrode therebetween, the internal electrode wrapping around opposite ends of both plates and extending over a portion of the external surfaces of the plates at either of the ends thereof. An external electrode is centrally disposed on each of the plates on the external surface thereof. The bender element is bonded at one of the ends thereof to a base, the element-to-base interface being coextensive with a portion of the internal electrode which encloses the one end.

In another of its aspects, the invention provides an improved piezoelectric sensor including a bender element having a third piezoceramic plate sandwiched between a pair of external piezoelectric plates. An internal electrode having two planar surfaces coextensive with the major surfaces of the third plate separates the third plate from each of the external plates. The internal electrode encloses opposite ends of the sensor and extends over a portion of the external surfaces of the external plates adjacent to the ends thereof. The bender element is bonded at one of the ends thereof to a base, the base-to-element interface being coextensive with a portion of the internal electrode extending over one of the external plates.

The bender element may be formed as a monolithic structure from green-state ceramic sheets and electrodes of a refractory metal deposited prior to sintering of the structure. Alternatively, the bender element may be formed as a laminated structure of piezoelectric plates having metal electrodes deposited thereon. All piezoceramic elements of the sensor are uniformly polarized.

BRIEF DESCRIPTION OF THE DRAWING

The invention is pointed out with particularity in the appended claims, however, other features of the invention will become more apparent and the invention will best be understood by referring to the following description in conjunction with the accompanying drawings in which:

DESCRIPTION OF THE PREFERRED EMBODIMENT

Figure 1:
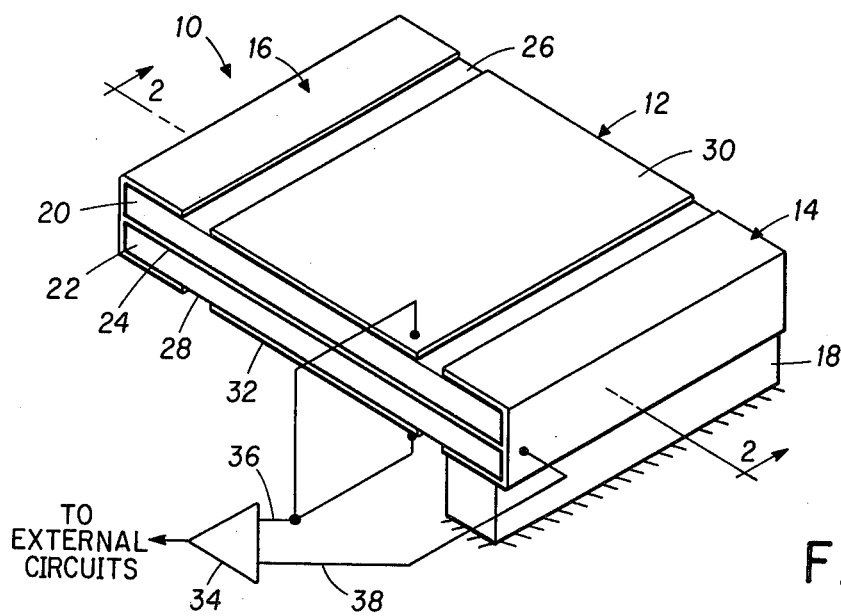
FIG. 1 is a perspective view of a piezoelectric sensor in accordance with the invention.
Figure 2:
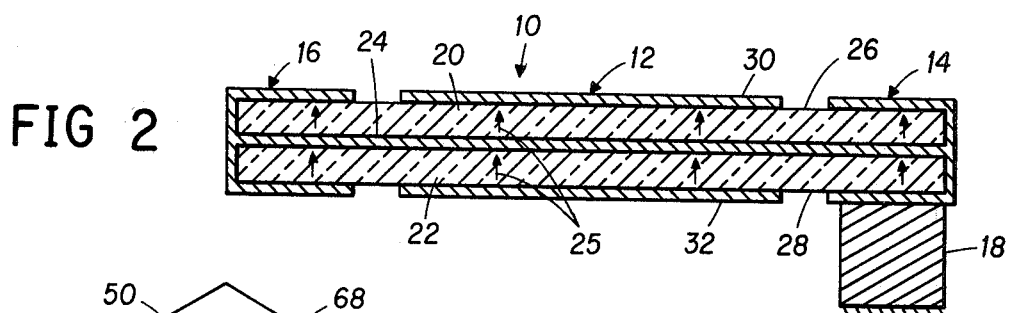
FIG. 2 is a view in section, taken along Line 2—2, of the piezoelectric sensor of FIG. 1.

Referring now to the various views of the drawing for a more detailed description of the materials, construction, operation and other features of my invention by characters of reference, FIGS. 1 and 2 show the general features of a sensor 10 constructed in accordance with the present invention. The sensor 10, which is a piezoelectric device, comprises a cantilevered bender element 12 having a first end or root region 14 and a free end 16. The root region 14 of the bender element 12 is affixed to a mounting member or base 18 as by soldering or bonding with epoxy adhesive.

The piezoelectric bender element 12 of FIGS. 1 and 2 is in the form of a flat slab which is considerably wider than it is thick and of greater length than width. The relative dimensions in length and width of a bender element such as the bender element 12 are application dependent, e.g., relatively high device resonant frequency and low impedance could dictate a device having greater width than length. The bender element 12 is constructed of a pair of like-sized thin plates 20, 22 of piezoelectric material having an internal electrode 24 sandwiched therebetween. The plates 20, 22 are composed of a polycrystalline aggregate such as lead zirconate titanate, both plates being uniformly polarized in the same direction (as indicated in FIG. 2 by arrows 25) normal to major surfaces 26, 28 of the plates 20, 22. The internal electrode 24 is coextensive with the internal major surface of each of the plates 20, 22; and at either longitudinal end 14, 16 of the device 10 the internal electrode 24 wraps around the edges of both plates 20, 22 and extends over a portion of the external major surface 26, 28 of each of the plates 20, 22. An external electrode 30, 32 is formed centrally disposed on the external major surface 26, 28 of each of the plates 20, 22 between and electrically isolated from the end portions of the internal electrode 24. It is well known in the art that external forces applied to a bender element such as the bender element 12, which forces are of sufficient magnitude to cause mechanical bending stress of the element, will result in the development of a voltage between the electrode terminals of the device, which voltage is representative of the applied force. The electrodes 24, 30, 32 of the presently described bender element 12 embodiment are connected in a parallel circuit relationship with an amplifier 34, as shown in FIG. 1; it is understood that the bender element 12 may be connected for series operation if the plates 20, 22 are oppositely poled, the choice between series and parallel operation being governed primarily by voltage and impedance requirements of the implementation. The kind of connection dictates the direction of polarization of the one plate 20 with respect to the other 22; the direction of polarization of the layers, accordingly, must be fixed at the time of manufacture of the bender element 12. For parallel circuit connection, the plates 20, 22 must be polarized in the same direction. The external electrodes 30, 32 are connected by a common lead 36 to one input of the amplifier 34; the internal electrode 24 is connected to another input of the amplifier 34 via a lead 38. The amplifier 34 provides means for sensing the voltage generated between the electrodes as a result of mechanical deformation of the bender element 12.

Although the bender element 12 of FIGS. 1 and 2 is shown and described as a cantilever-mounted element, it is understood that the manner in which the element is mounted depends on the requirements of the particular application. Other mounting configurations such as beam mounting and nodal mounting may be used. Beam or edge mounted sensors exhibit smaller displacements with greater forces, and have higher resonant frequencies than cantilever-mounted elements of the same size. Nodal-mounted sensors have reduced mechanical damping and a consequent higher quality factor (Q) at resonance. The best-mode configuration for the present invention utilizes cantilever mounting to achieve greater displacement or flexure for a given force applied, and, correspondingly, a higher signal level output.

The electrode arrangement of the present invention electrically isolates a substantial portion of the ends of the bender element 12, making the end regions 14, 16 inactive in the circuit and thus providing structural symmetry and increased sensitivity of the element 10 as described hereinafter. Piezoelectric sensors are typically bonded to or clamped in rigid mounting members. Because the piezoelectric parameters vary with steady-state stress, and because steady-state stress in the base or mount region of a sensor can change with temperature, it is a feature of my invention to virtually eliminate the signal developed in the mount region from the output signal of the sensor, thereby improving long-term stability and repeatability of scale factor and impedance of the device. In addition, changes in the elastic modulus of the bonding material at the interface, change the distribution of stresses in the mount area of the bender element, which in turn can change the effective length of the bender element and thus affect scale factor. The present invention, by removing the mount region from the active sensor allows the effective length of the bender element to be defined more by the configuration of the active electrode plating and to be less influenced by variable strains in the mount and the sensor-to-mount bond.

Figure 3:
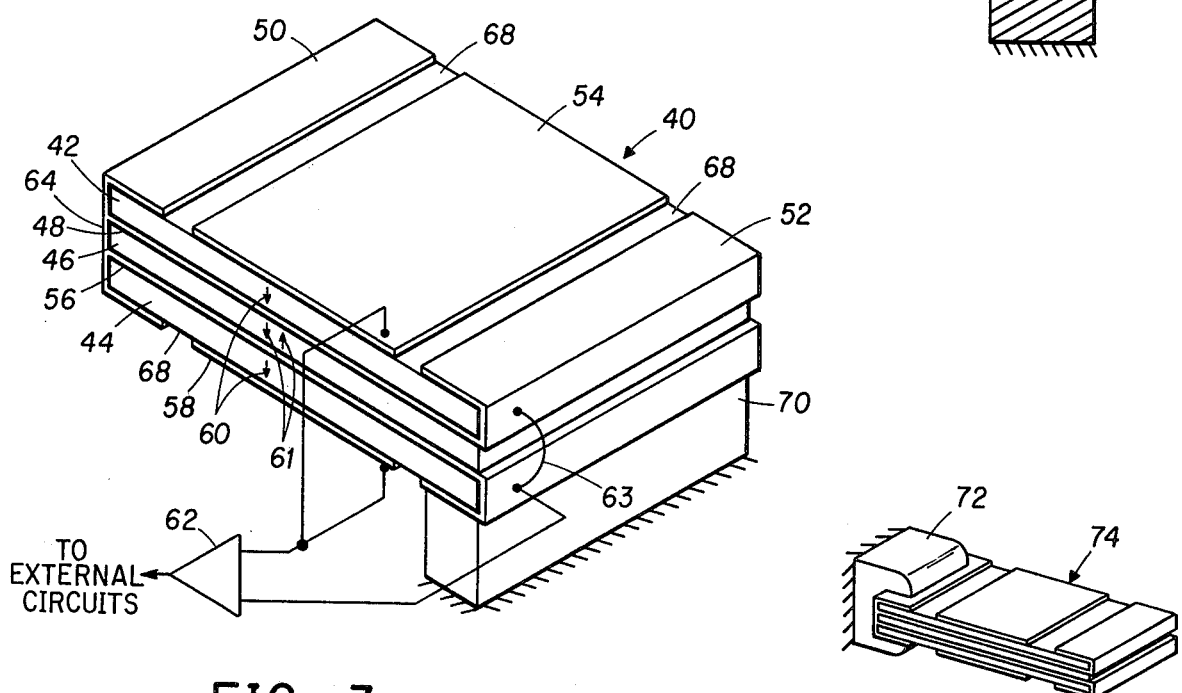
FIG. 3 is a perspective view of another embodiment of a piezoelectric sensor in accordance with the invention.

Referring now to FIG. 3, a best mode embodiment of a piezoelectric ceramic sensor 40 is shown comprising a flat slab considerably wider than it is thick and of greater length than width. The sensor 40 is constructed of a first plate 42 and a second plate 44 of piezoelectric material exteriorly disposed, and a third plate 46 of piezoelectric material interiorly disposed and sandwiched between the exterior plates 42, 44. In prior art devices, a third or internal plate of appreciable thickness, usually brass, steel or other alloy is utilized to strengthen the structure, to raise the characteristic resonant frequency of device of given size while maintaining the same output impedance and to optimize the strength of the output signal (a function of the thickness of the third plate). It is a feature of the present invention to make the internal plate 46 of piezoelectric material; the adverse effects on sensor linearity and repeatability caused by differences in coefficients of expansion between the active piezoelectric plates and the internal plate are thus reduced. The first exterior plate 42 includes an internal electrode 48 between and coextensive with both the internal major surface of that plate 42 and the adjacent major surface of the third plate 46. At either longitudinal end 50, 52 of the sensor 40, the internal electrode 48 wraps around the longitudinal edges of the plate 42 and extends over a portion of the external major surface of the plate 42. An external electrode 54 is formed centrally disposed on the external major surface of the plate 42 between and electrically isolated from the end portions of the internal electrode 48. The sensor 40 is symmetrically constructed; therefore, the second exterior plate 44 includes an internal electrode 56 between and coextensive with both the internal major surface of the plate 44 and the adjacent major surface of the third plate 46. At either end 50, 52 of the sensor 40, the internal electrode 56 wraps around the longitudinal edges of the plate 44 and extends over a portion of the external major surface of the plate 44. An external electrode 58 is formed centrally disposed on the external major surface of surface of the plate 44 between and electrically isolated from the end portions of the internal electrode 56. Each of the external layers 42, 44 of piezoelectric ceramic material is uniformly polarized in a direction normal to the major plane of the sensor 40, as indicated in FIG. 3 by arrows 60, the direction of polarization (i.e., either downward as shown in FIG. 3, or upward) of the exterior plates 42, 44 with respect to each other being a function of their connection in a circuit. The plates 42, 44 being polarized in the same direction are connected in a parallel circuit, as shown in FIG. 3. The third or internal plate 46 of piezoelectric material may be polarized uniformly in either direction as shown by the arrows 61, FIG. 3. All piezoceramic elements of the structure 40 are uniformly polarized to minimize internal stresses in the structure at extreme temperatures, thus improving long term stability of the piezoelectric properties. Uniform polarization of the ceramic material means that all regions of the material, regardless of the configuration of the signal electrodes are equally polarized on the same poling vector throughout the plate; there are no unpolarized regions in the plate. The external electrodes 54, 58 are connected together to another input of the amplifier 62. The electrical connection between the internal electrodes 48, 56 may be effected by a wire 63 connection as shown at the right-hand (as viewed in FIG. 3) end of the sensor 40, or by depositing electrode material 64 on the edge of the third plate 46 thereby electrically connecting the electrodes 48, 56 as shown, for example, at the left-hand end 50 (as viewed in FIG. 3) of the sensor 40. Referring still to FIG. 3, a typical bender element such as the bender element 40 comprises a laminar structure approximately 1.905 centimeters long, 1.27 centimeters wide and 1.016 millimeters thick. The outer or external layers 42, 44 of piezoceramic are 0.254 millimeters thick; the internal piezoceramic layer 46, 0.508 millimeters thick. The external electrodes 54, 58 are each 8.89 millimeters long and centrally disposed on the external surfaces of the bender element. The internal electrodes 48, 56 each wrap around the ends 50, 52 and extend over the external surface of the corresponding plates 42, 44 a longitudinal distance of 3.81 millimeters. The external electrodes are thus spaced apart from the internal electrode 1.25 millimeters at the gaps 68.

Figure 4:
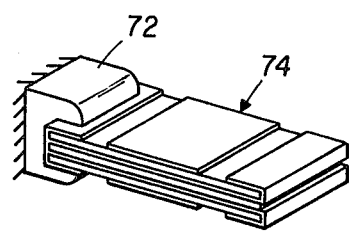
FIG. 4 is a perspective view of another embodiment of a piezoelectric sensor in accordance with the invention.

The sensor 40 of FIG. 3 is affixed at one end 52 thereof to a mounting member or base 70 as by bonding with solder or an adhesive. The base 70 is preferably formed from a low-expansion steel alloy such as one containing approximately 36% nickel; the bonding medium (not shown) may be a high-strength low-compliance, epoxy adhesive. The sensor 40-to-base 70 interface is located at the end 52 which is one of the electrically inactive portions of the sensor 40; the mechanical stresses occurring at the interface thus have minimal effect on output electrical signals of the sensor 40. Likewise, the free end 50 of the cantilever mounted sensor 40 is isolated electrically from the centrally disposed active-circuit portion of the sensor. In a preferred embodiment of the sensor, the base is bonded to one major surface at one end of the bender element, the edge and the opposite major surface remaining free of constraint. It is understood, however, that the sensor of the present invention may be implemented as shown in FIG. 4, wherein a mounting member 72 grips both major surfaces of the bender element 74.

The bender element of the present invention may be formed as a monolithic structure. Such structures are produced by preparing a slurry including a suitable particulate dielectric material, e.g., barium titanate or lead zirconate titanate, a resin binder material, a solvent for the resin binder, and generally a plasticizing agent. The slurry is spread on a base and dried to form thin flexible sheets, commonly termed green-state ceramic sheets. And electrode paste film is deposited in the appropriate configuration on a surface of the sheets. The electrode material may be of the noble metals or their alloys, or of lower cost base metal depending on the firing temperature and conditions of ceramic formation. The electroded green ceramic is cut to the desired shape and stacked to form a monolithic structure. The stacked layers are fired to completely burn out residual organic binders and solvents of the ceramic and electroding paste, and to sinter and fully densify the ceramic. The structure may be cooled, or subsequently reheated and cooled, in the presence of a strong direct current electric field(s) to align the molecular dipoles of the ceramic uniformly in the direction of the applied field, thereby providing the ceramic with piezoelectric properties. Electrode paste or paint may be applied to the device, or previously deposited electrode material may be removed chemically or mechanically to complete formation of the desired electrode configuration in accordance with the invention. Alternatively, the bender element may be constructed by bonding together preformed and uniformly polarized piezoceramic plates having thin electrodes formed on the major surfaces thereof. In the latter instance, the end or edge metallization may be applied as paint. The uniformity of polarization of the piezoceramic material is an important aspect of the present invention; internal stresses in the structure at extreme temperatures are minimized when the piezoceramic material is uniformly polarized. Accordingly, during manufacture, the surface electrode configuration is established or altered after the ceramic is poled in order to achieve uniformity of polarization at locations such as the end region 50, 52 (see FIG. 3) and the gaps 68 adjacent thereto.

Obviously, many modifications and variations of my invention are possible in the light of the above teachings. It is therefore understood that my invention may be practiced otherwise than as specifically described and it is intended by the appended claims to cover all such modifications of the invention which fall within the true spirit and scope of the invention.

What is claimed is:

1. A sensor assembly, comprising:
   a bender element having
   a pair of plates of piezoceramic material, each of said plates having an internal major surface, an external major surface, and a pair of oppositely disposed end walls;
   an internal electrode between said plates, said electrode having planar surfaces coextensive and in electrical contact with the internal surface of each of said plates, and end portions coextensive and in electrical contact with the end walls of said plates, the end portions extending over a minor portion of the external major surfaces of said plates adjacent each of said end walls;
   a pair of planar external electrodes, each in electrical contact with a major portion of the external surface of a corresponding one of said pair of plates, said external electrodes being electrically isolated from the end portions of said internal electrode, said external electrodes being oppositely disposed from each other on the external surfaces of said plates, said plates being uniformly polarized in a direction normal to said electrodes;

a base member bonded to one of the end portions extending over one of the external major surfaces, said bender element extending in cantilevered fashion from the base member; and means coupled to said electrodes for detecting an electric field generated between said electrodes when said bender element is subjected to bending force.

2. A sensor, comprising: a bender element having first and second plates of piezoceramic material, each of said plates having an internal major surface, an external major surface, an end wall at each of two oppositely disposed ends thereof, an internal electrode having first and second planar surfaces, the first planar surface being coextensive with the internal major surface of a corresponding one of said pair of plates, the internal electrode having external end portions coextensive with the end walls of said one plate and extending over a portion of the external major surface of said one plate adjacent each of the end walls, and an external electrode in electrical contact with a major portion of the external major surface of said one plate, the external electrode being electrically isolated from the external end portions of the internal electrode;

a third plate of piezoceramic material between said first and second plates, said third plate having oppositely disposed major surfaces each coextensive with the second planar surface of the internal electrode of one of said first and second plates, the internal electrodes being electrically connected, the external electrodes being oppositely disposed from each other on the external major surfaces of said first and second plates, said plates being uniformly polarized in a direction normal to said electrodes;

means for mounting said bender element; and means coupled to said electrodes for detecting an electric field generated between said electrodes when said bender element is subjected to bending force.

3. The sensor as claimed in claim 2, wherein said mounting means comprises a base member bonded to one of the end portions of said internal electrode, said bender element extending in cantilevered fashion from the base member.

4. The sensor as claimed in claim 3, wherein the base member is bonded exclusively to the one end portion extending over one of the external major surfaces.

5. The sensor as claimed in claim 1 or 2, wherein said bender element is a monolithic device, said electrodes comprising a refractory metal sintered in situ with the piezoceramic material.

6. The sensor as claimed in claims 1 or 2, wherein said bender element is a laminated structure, said plates being vitrified ceramic, and said electrodes on the major surfaces of said plates being sheet metal bonded to said major surfaces.

7. The sensor as claimed in claim 1 or 2, wherein said bender element is a laminated structure, said plates being vitrified ceramic, and said electrodes being metal deposited on the vitrified ceramic.

* * * * *